US011320658B2

(12) United States Patent
Jang et al.

(10) Patent No.: US 11,320,658 B2
(45) Date of Patent: May 3, 2022

(54) DISPLAY APPARATUS

(71) Applicant: LG DISPLAY CO., LTD., Seoul (KR)

(72) Inventors: Sukhyeun Jang, Paju-si (KR); Seungmin Baik, Paju-si (KR); Goeun Jung, Paju-si (KR); Hojin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 241 days.

(21) Appl. No.: 16/181,558

(22) Filed: Nov. 6, 2018

(65) Prior Publication Data

US 2019/0137766 A1 May 9, 2019

(30) Foreign Application Priority Data

Nov. 6, 2017 (KR) .................... 10-2017-0146985

(51) Int. Cl.
*G02B 27/01* (2006.01)
*H01L 51/52* (2006.01)
*H01L 27/32* (2006.01)
*H01L 51/56* (2006.01)
*H01L 51/00* (2006.01)

(52) U.S. Cl.
CPC ..... *G02B 27/0176* (2013.01); *G02B 27/0172* (2013.01); *H01L 27/322* (2013.01); *H01L 51/5246* (2013.01); *H01L 51/5253* (2013.01); *H01L 51/56* (2013.01); *G02B 2027/015* (2013.01); *G02B 2027/0152* (2013.01); *H01L 27/3276* (2013.01); *H01L 51/003* (2013.01); *H01L 2227/323* (2013.01); *H01L 2227/326* (2013.01)

(58) Field of Classification Search
None
See application file for complete search history.

(56) References Cited

U.S. PATENT DOCUMENTS

| | | | | |
|---|---|---|---|---|
| 2011/0037713 A1* | 2/2011 | Chen | ...................... | G06F 3/045 |
| | | | | 345/173 |
| 2015/0185481 A1 | 7/2015 | Hiraide | | |
| 2016/0048017 A1* | 2/2016 | Kasahara | ............. | G02B 17/006 |
| | | | | 359/633 |

(Continued)

FOREIGN PATENT DOCUMENTS

| | | | |
|---|---|---|---|
| CN | 101900872 A | 12/2010 | |
| CN | 202306002 U | 7/2012 | |

(Continued)

OTHER PUBLICATIONS

Chinese Office Action dated Sep. 28, 2020 issued in Patent Application No. 201811277087.1 w/English Translation (17 pages).

*Primary Examiner* — Christopher Stanford
*Assistant Examiner* — Journey F Sumlar
(74) *Attorney, Agent, or Firm* — Polsinelli PC

(57) ABSTRACT

Provided is a display apparatus reduced in size and weight by reducing a size of a lens member. A head-mounted display apparatus includes a display panel emitting light, a lens member directing light from the display panel forwards, a light guide guiding light transmitting through the lens member to a user's eyes, a reflector and a transflective reflector changing a path of light moving along the light guide, and an adhesive layer disposed between the display panel and the lens member and adhering the display panel and the lens member.

16 Claims, 8 Drawing Sheets

(56) References Cited

U.S. PATENT DOCUMENTS

2017/0082784 A1*   3/2017   Niu ..................... H04M 1/0266
2018/0323405 A1*  11/2018   Moon ................. H01L 51/5271

FOREIGN PATENT DOCUMENTS

| CN | 104749781 A | 7/2015 |
| CN | 104980535 A | 10/2015 |
| CN | 105321429 A | 2/2016 |
| CN | 107272198 A | 10/2017 |
| KR | 20170010042 A | 1/2017 |
| WO | 00/79328 A1 | 7/2000 |

\* cited by examiner (a)　　　　　　　　　　(b)

DISPLAY APPARATUS

CROSS REFERENCE TO RELATED APPLICATION

This application claims the priority benefit of Korean Patent Application No. 10-2017-0146985 filed on Nov. 6, 2017, which is incorporated herein by reference in its entirety for all purposes as if fully set forth herein.

BACKGROUND

Field of the Disclosure

The present disclosure relates to a display apparatus.

Description of the Background

Demand for display apparatuses for displaying images in various forms has increased. A display field has rapidly shifted from voluminous cathode ray tubes (CRTs) to thinner, lighter, larger flat panel displays (FPDs). The FPDs include a liquid crystal display (LCD), a plasma display panel (PDP), an organic light emitting display apparatus, an electrophoretic display (ED), and the like.

Among them, the organic light emitting display apparatus is a self-luminous device which advantageously has a fast response speed and high luminous efficiency and brightness, and a wide viewing angle. In particular, the organic light emitting display apparatus may be formed on a flexible plastic substrate and may be driven at a lower voltage, consume less power, and is excellent in color representation, compared with the PDP or an inorganic electroluminescence (EL) display.

Recently, a head-mounted display (HMD) including an organic light emitting display has been developed. The HMD is a glasses-type monitor device of a virtual reality (VR) or augmented reality (AR), which is worn as glasses or a helmet and in which a focal point is formed near in front of the user's eyes. However, since the HMD is directly worn on the users, the HMD is required to be reduced in size and weight.

SUMMARY

Accordingly, the present disclosure is directed to a display apparatus that substantially obviates one or more of problems due to limitations and disadvantages of the prior art.

More particularly, the present disclosure provides a display apparatus realized to be small and light by reducing the size of a lens member.

In an aspect of the present disclosure, a display apparatus includes: a display panel emitting light; a lens member directing light from the display panel forwards; a light guide guiding light transmitting through the lens member to a user's eyes; and a reflector changing a path of light moving along the light guide, wherein the display panel is curved along a curved surface of the lens member and adhered to the lens member.

In another aspect of the present disclosure, a head mounted display apparatus comprises a display panel emitting light; a lens member having a curved surface and transmitting the light emitted from the display panel; a light guide guiding the transmitted light through the lens member to a user's eyes; a reflector changing a path of the light guided by the light guide; and a transflective reflector changing the light path from the reflector guided by the light guide to the user's eyes, wherein the display panel attached to the lens member has a curved surface matching the curved surface of the lens member.

The display apparatus may further include: a compensation member disposed between the display panel and the lens member and guiding light from the display panel, wherein the compensation member may be curved along a curved surface of the lens member and adhered to the lens member.

The display panel may be curved along a curved surface of the compensation panel and adhered to the compensation member.

The display apparatus may further include: an adhesive layer disposed between the display panel and the lens member.

The display apparatus may further include: an adhesive layer disposed between the display panel and the compensation member and disposed between the display panel and the lens member.

The display panel may include: an organic light emitting diode (OLED) positioned on a thin film transistor (TFT) array substrate; and an encapsulant layer positioned on the OLED.

The adhesive layer may be positioned between the encapsulant layer and the lens member.

The display apparatus may further include: a color filter layer positioned between the encapsulant layer and the adhesive layer.

In another aspect, a display apparatus includes: a display panel; a lens member positioned in front of the display panel; a light guide positioned in front of the lens member; and a reflector positioned on one side of the light guide, wherein the display panel is curved along a curved surface of the lens member and adhered to the lens member.

The display apparatus may further include: a compensation member disposed between the display panel and the lens member, wherein the compensation member may be curved along a curved surface of the lens member and adhered to the lens member.

The display apparatus may further include: a transflective reflector positioned on the other side of the light guide and facing the reflector.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
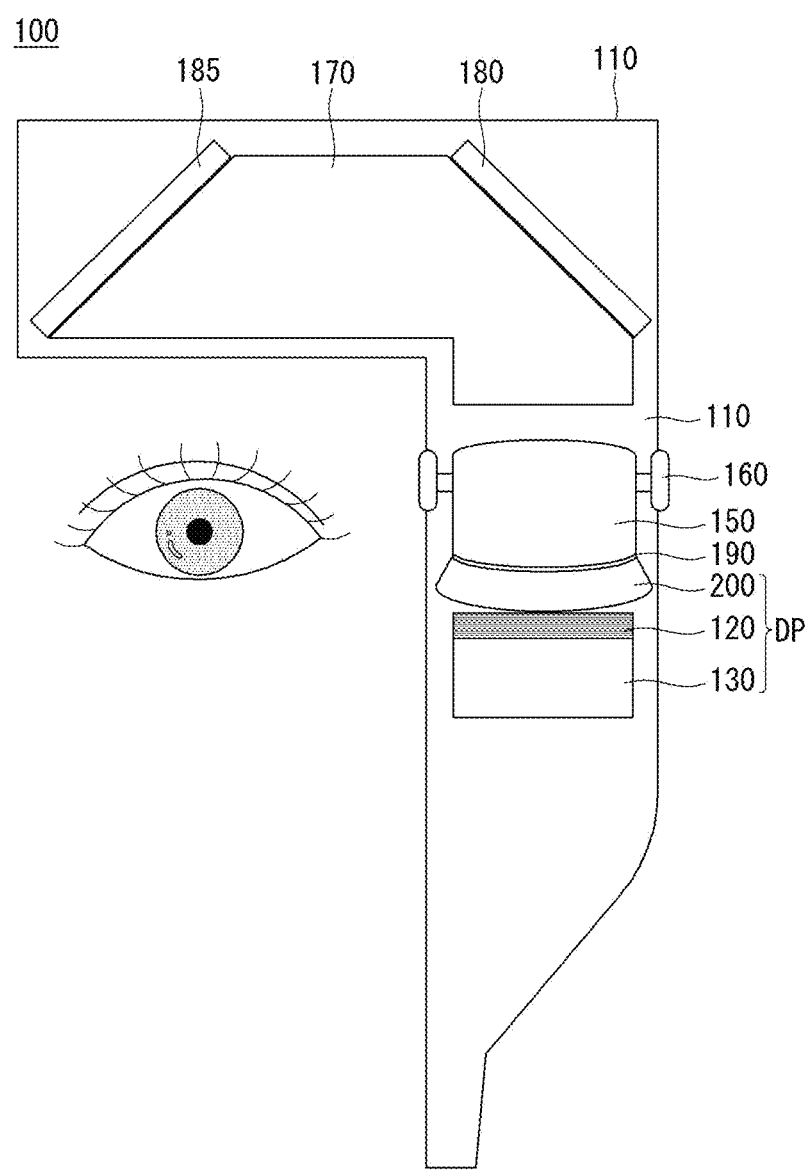
FIG. 1 is a view illustrating the entirety of a display apparatus according to an aspect of the present disclosure.

Hereinafter, aspects of the present disclosure will be described in detail with reference to the accompanying drawings. Throughout the specification, the like reference numerals denote the substantially same elements. In the following description, when the detailed description of the relevant known function or configuration is determined to unnecessarily obscure an important point of the present disclosure, the detailed description will be omitted. Names of elements used in the following description are selected for the description purpose and may be different from those of actual products. In describing a position relationship, for example, when two portions are described as "~on", "~above", "~below", or "~on the side", one or more other portions may be positioned between the two portions unless "immediately" or "directly" is used.

A display apparatus according to the present disclosure is a micro-display which has a size of 1.5 inches or less and requires magnification or projection to see a screen. Micro-displays require magnification or any other optical element to see the screen. The micro-display, including liquid crystal or an organic light emitting diode (OLED) on a silicon wafer (Si-wafer), advantageous has electrons of high mobility. Therefore, it is possible to manufacture a circuit having good quality in both ON and OFF.

The display apparatus according to the present disclosure may be an organic light emitting display apparatus having an OLED, among the aforementioned micro-displays. The organic light emitting display apparatus includes an emission layer formed of an organic material between a first electrode, which is an anode, and a second electrode, which is a cathode. Thus the organic light emitting display apparatus is a self-luminous display apparatus in which holes supplied from the first electrode and electrons supplied from the second electrode are combined in the emission layer to form excitons as hole-electron pairs, and light is emitted by energy generated as the excitons fall to a ground state. However, the display apparatus according to the present disclosure may be a liquid crystal display apparatus other than the organic light emitting display apparatus.

Hereinafter, aspects of the present disclosure will be described with reference to the accompanying drawings.

Figure 2:
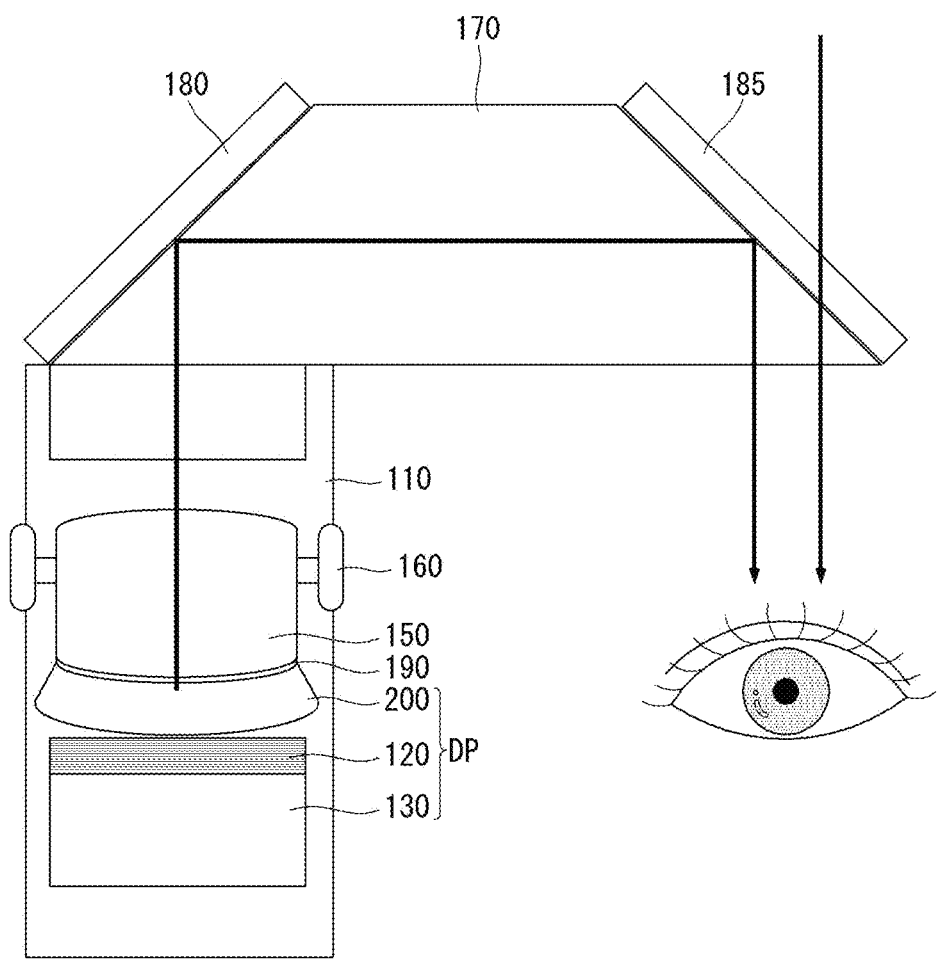
FIG. 2 is a view illustrating a part of a display apparatus according to an aspect of the present disclosure.
Figure 3:
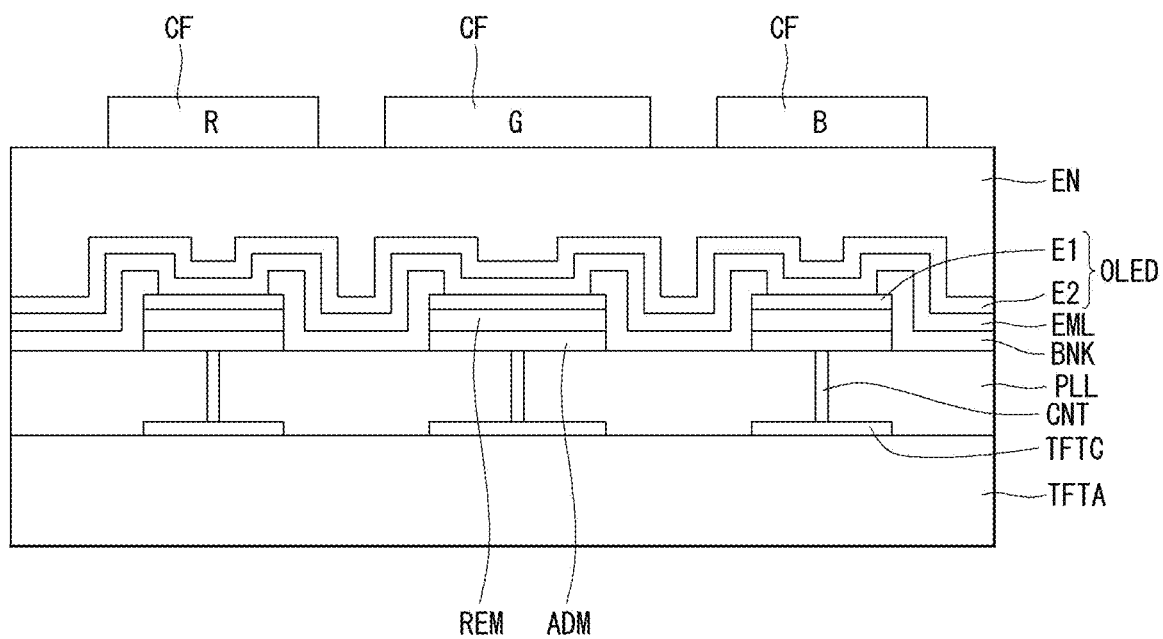
FIG. 3 is a cross-sectional view illustrating a display panel according to an aspect of the present disclosure.

FIG. 1 is a view illustrating the entirety of a display apparatus according to an aspect of the present disclosure, and FIG. 2 is a view illustrating a portion of a display apparatus according to an aspect of the present disclosure. FIG. 3 is a cross-sectional view illustrating a display panel according to an aspect of the present disclosure.

Referring to FIG. 1, a display apparatus 100 according to an aspect of the present disclosure includes a case 110, a display device DP, a lens member 150, a light guide 170, a reflector 180, and a transflective reflector 185.

The case 110 accommodates at least the display device DP and the lens member 150, and may be manufactured as an integral type through injection molding. Some of the light guide 170, the reflector 180, and the transflective reflector 185 may be positioned outside the case 110, and in the present aspect, they are illustrated to be accommodated inside the case 110, for example.

Referring to FIG. 2, the display device DP accommodated in the case 110 includes a display panel 200 for implementing an image, a printed circuit board (PCB) 130 for driving the display panel 200, and a flexible circuit board for applying a signal from the PCB 130 to the display panel 200.

The display panel 200 outputs information, in the form of light, including a visual image to a user. For example, the display panel 200 may be a micro-display in which a liquid crystal or an organic light emitting diode (OLED) is formed on a silicon wafer on which a plurality of thin film transistors (TFTs) are formed. A specific structure of the display panel 200 will be described later.

A flexible circuit board 120 is provided on one side of the display panel 200 and applies a signal from the PCB 130 to the display panel 200. The flexible circuit board 120 is flexible and is folded in the case 110. The PCB 130 is disposed on a rear surface of the display panel 200 and forms a display device DP.

The lens member 150 allows light emitted from the display panel 200 to be oriented to the front reflector 180. The lens member 150 may include a single lens or a plurality of lenses. In this aspect, one convex lens will be described as an example. The lens member 150 allows light emitted from the display panel 200 to move straight to the front reflector 180 without being spread to the left and right through the convex lens member 150. Accordingly, all the light of the display panel 200 is incident on the user's eyes and quality of an image may be maintained. The lens member 150 is coupled to the case 110 through a fastening joint 160.

The light guide 170 is a passage through which light emitted from the lens member 150 moves. The light guide 170 is positioned in front of the lens member 150 or positioned to include the lens member 150 and extends in a direction substantially parallel to a movement direction of light emitted through the lens member 150. In the present disclosure, an example in which the light guide 170 is disposed in front of the lens member 150 will be described.

Light moving inside the light guide 170 is totally reflected. The light guide 170 may be selected from among polymethylmethacrylate (PMMA), polycarbonate (PC), and glass to totally reflect light, and a known material having high light transmittance may also be used.

In order for light to move to the user's eyes, the reflector 180 and the transflective reflector 185 for reflecting light are positioned.

The reflector 180 is disposed on one side of the light guide 170 and changes a movement path of light to make the light traveling through the light guide 170 be incident to the user's eye. That is, light traveling in the light guide 170 is reflected from the reflector 180 and changed in movement path toward the transflective reflector 185 positioned in front of the user's eyes.

The transflective reflector 185 is positioned on the other side of the light guide 170 facing the reflector 180. The transflective reflector 185 allows light reflected from the reflector 180 to be incident to the user's eye. In particular, the transflective reflector 185 allows an external image and an image of the display panel to be mixed using transflection and reflection characteristics and provided to the user's eyes.

In the display apparatus according to an aspect of the present disclosure configured as described above, light emitted from the display device DP may be transmitted through the lens member 150 and may be incident to the user's eye through the reflector 180 and the transflective reflector 185 so that the user may recognize the external image and the image of the display panel.

Referring to a cross-sectional structure of the display panel 200 with reference to FIG. 3, metal layers TFTC, CNT, REM, and ADM mediating electrical connection with a TFT part and assisting upward exit of light generated by an emission layer EML are positioned on a TFT array substrate which is a silicon wafer on which TFTs are formed.

The first metal layer TFTC is positioned on the TFT array substrate TFTA. The first metal layer TFTC is selected as a source electrode or a drain electrode of a driving transistor included in the TFT array substrate TFTA or as a separate metal layer connected thereto. The first metal layer TFTC serves as an electrode contact metal layer to help electrical connection between the source electrode or the drain electrode of the driving transistor and a lower electrode layer E1.

A planarization layer PLL is positioned on the first metal layer TFTC. The planarization layer PLL has a certain thickness and serves to flatten a surface of the TFT array substrate TFTA. The planarization layer PLL may be formed of an organic material such as a negative overcoat layer, polyimide, benzocyclobutene-based resin, acrylate, photoacrylate, and the like, but is not limited thereto.

The second metal layer CNT is positioned to penetrate through the planarization layer PLL. The second metal layer CNT is electrically connected to the first metal layer TFTC exposed in a lower portion of the planarization layer PLL. The second metal layer CNT serves as an electrode contact metal layer for assisting electrical connection between the source electrode/the drain electrode of the driving transistor and the lower electrode layer E1 together with the first metal layer TFTC.

The third metal layer ADM is positioned on the planarization layer PLL. The third metal layer ADM is electrically connected to the second metal layer CNT penetrating through the planarization layer PLL. The third metal layer ADM and the second metal layer CNT may be integrally formed or may be formed separately as illustrated. The third metal layer ADM serves to increase adhesion on a surface of the planarization layer PLL and serves as an electrode contact metal layer helping electrical connection between the source electrode or the drain electrode of the driving transistor and the lower electrode layer E1 together with the first metal layer TFTC and the second metal layer CNT.

The fourth metal layer REM is positioned on the third metal layer (ADM). The fourth metal layer REM is electrically connected to the third metal layer ADM. The fourth metal layer REM serves as a reflective layer helping upward exit of light emitted from the emission layer EML and serves as an electrode contact metal layer helping electrical connection between the source electrode or the drain electrode of the driving transistor and the lower electrode layer E1 together with the first, second, and third metal layers TFTC, CNT, and ADM.

The lower electrode layer E1 is positioned on the fourth metal layer REM. The lower electrode layer E1 is selected as an anode or a cathode. For example, when the lower electrode layer E1 is selected as an anode, it may be formed of an oxide such as indium tin oxide (ITO), indium zinc oxide (IZO), or the like, but is not limited thereto.

The bank layer BNK is positioned on the planarization layer PLL. The bank layer BNK covers the lower electrode layer E1 and exposes a portion thereof. The bank layer BNK serves to define an emission region of a subpixel. The bank layer BNK may be formed of an organic material such as polyimide, benzocyclobutene-based resin, acrylate, and photoacrylate, but is not limited thereto.

The organic layer EML is positioned on the lower electrode layer E1. The organic layer EML includes an emission layer emitting at least one color and includes functional layers for controlling injection and transport of electrons and holes, and the like. The emission layer may include stacked red, green, and blue emission layers to emit white light or may include stacked blue and yellow green emission layers to emit white light. The functional layers may include a hole injection layer, a hole transport layer, a charge generation layer, an electron transport layer, an electron injection layer, and the like.

An upper electrode layer E2 is positioned on the organic layer EML. The upper electrode layer E2 is selected as a cathode or an anode. For example, when the upper electrode layer E2 is selected as a cathode, the upper electrode layer E2 may be formed of aluminum (Al), magnesium (Mg), silver (Ag), or an alloy thereof, having a low work function but is not limited thereto. Accordingly, an organic light emitting diode (OLED) including the lower electrode layer E1, the organic layer EML, and the upper electrode layer E2 is provided.

An encapsulant layer EN is disposed on the OLED. The encapsulant layer EN protects the OLED from ambient moisture and impact and is formed as a multilayer thin film or a film by alternately depositing organic and inorganic materials.

The color filter layers CF are positioned on the encapsulant layer EN. The color filter layers CF convert white light exiting through the encapsulant layer EN into red, green and blue light through the red color filter R, the green color filter G and the blue color filter B. To this end, the color filter layers CF are disposed with a size corresponding to the area of each subpixel. Although the color filter layers CF are illustrated and described in the present disclosure, the color filter layers CF may be omitted.

As described above, the display apparatus of the present disclosure includes the display panel having the OLED and the color filter layers on the TFT array substrate as a silicon wafer.

Meanwhile, a display apparatus according to an aspect of the present disclosure has a structure in which a lens member and a display panel are adhered.

Referring again to FIG. 2, according to an aspect of the present disclosure, the display panel 200 is adhered to one surface of the lens member 150. As described above, the display panel 200 is a micro-display formed on a silicon wafer. In the present disclosure, the display panel 200 is made flexible by thinning the silicon wafer. Thinning of the silicon wafer may be performed by the through silicon via (TSV) technology known in the semiconductor field. It is a technology for temporarily attaching and detaching a supportive carrier wafer to prevent warping of the wafer after a rear surface of the silicon wafer is ground.

The display panel 200 of the present disclosure is manufactured by grinding the TFT array substrate formed up to the lower electrode layer to having a small thickness, attaching the carrier wafer, forming the OLED and the encapsulant layer with the carrier wafer attached thereto, and subsequently removing the carrier wafer. The display panel 200 manufactured in this manner has a flat plate shape; however, the silicon wafer is very thin, having flexibility. The display panel 200 is adhered to one surface of the lens member 150 by the medium of an adhesive layer 190 applied to one surface of the encapsulant layer. As the display panel 200 is adhered to one surface of the lens member 150, the display panel 200 is curved with the same curvature as that of the lens member 150 so as to be adhered.

Figure 4:
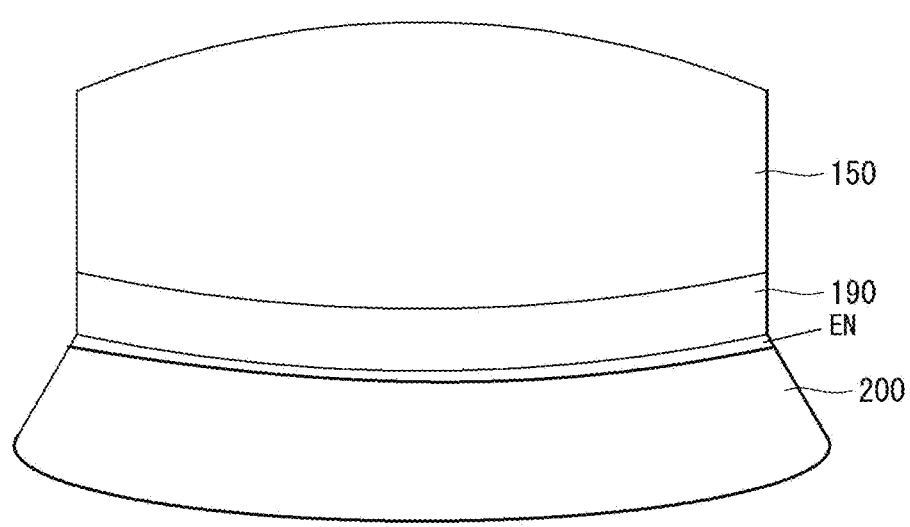
FIGS. 4 and 5 are views illustrating a bonding structure between a display panel and a lens member.
Figure 5:
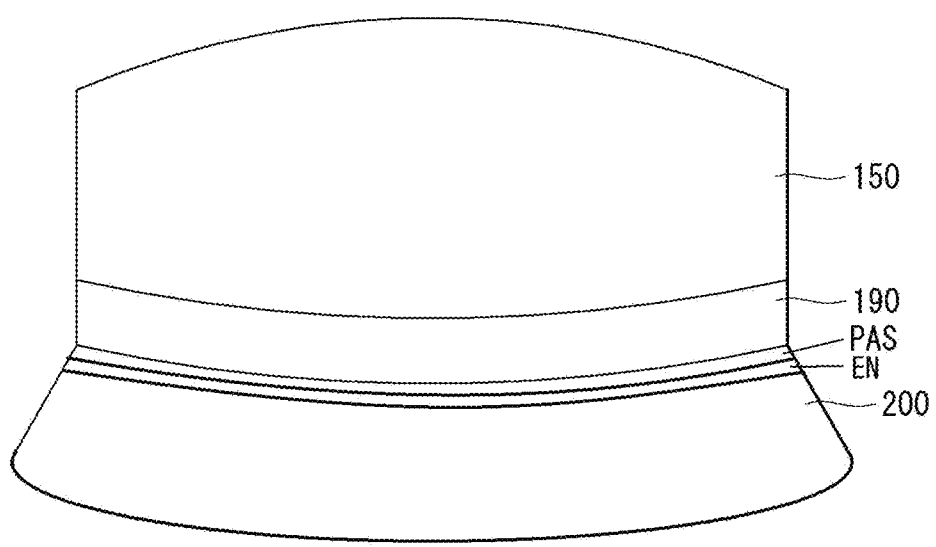

FIGS. 4 and 5 are views illustrating a bonding structure of a display panel and a lens member.

Referring to FIG. 4, the adhesive layer 190 may be directly in contact with the encapsulant layer EN formed on the display panel 200, for example. Accordingly, the adhesive layer 190 may be positioned between the encapsulant layer EN and the lens member 150 to adhere the display panel 200 and the lens member 150.

Referring to FIG. 5, a protective layer PAS may be disposed on the encapsulant layer EN formed on the display panel 200 according to an aspect of the present disclosure. The protective layer PAS may be an overcoat layer or a passivation layer protecting an underlying element. The adhesive layer 190 is positioned on the protective layer PAS. Thus, the adhesive layer 190 is positioned between the protective layer PAS and the lens member 150 to adhere the display panel 200 and the lens member 150. However, a color filter layer may further be disposed on the encapsulant layer EN of the present disclosure. In this case, the adhesive layer 190 may be positioned on the color filter layer.

When the display panel 200 is adhered to the lens member 150 as described above, the lens member 150 supports the display panel 200. In this case, the adhesive layer 190 may be positioned on the color filter layer. The display panel 200 of the present disclosure obtains flexibility by reducing the thickness of the TFT array substrate through a silicon wafer thinning process. However, if the TFT array substrate having the small thickness is present, the display panel may be warped due to film stress of the layers stacked on the TFT array substrate and the films may be damaged. In order to prevent the display panel from warping, a support glass capable of supporting the display panel is required. However, according to the present disclosure, since the lens member 150 supports the display panel such that the display panel is not warped, a support glass may be omitted, reducing the weight of the display apparatus.

Figure 6:
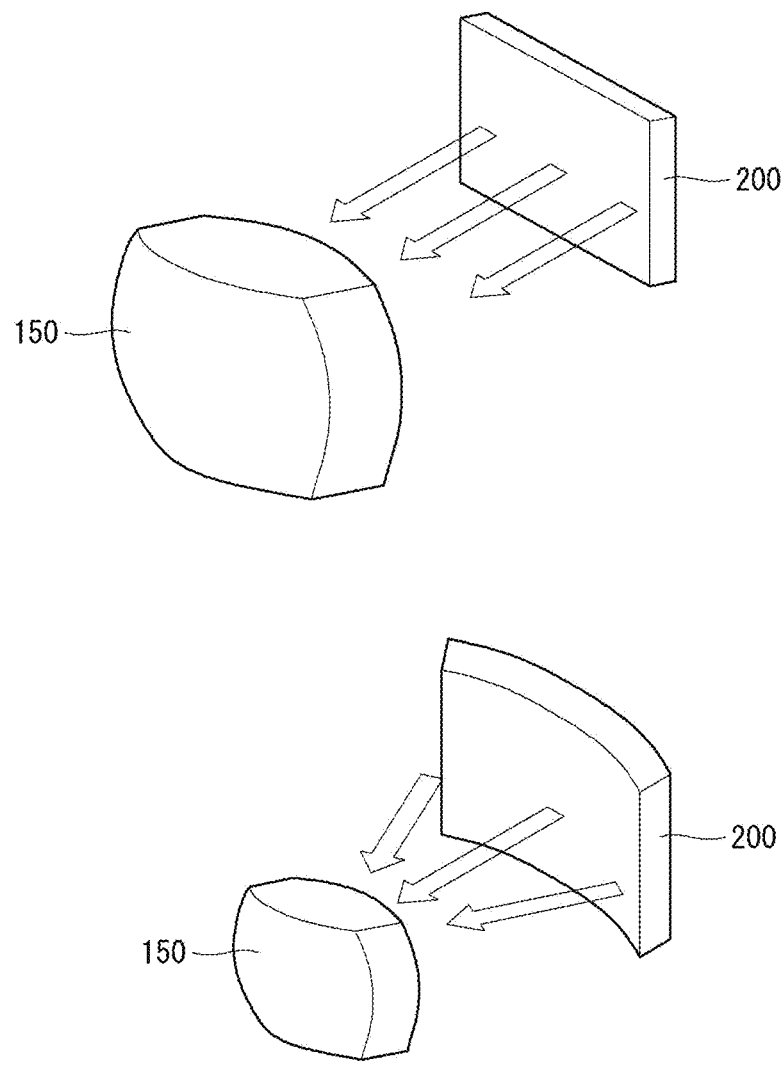
FIG. 6 is a schematic view illustrating a light path between a lens member and a display panel.
Figure 7:
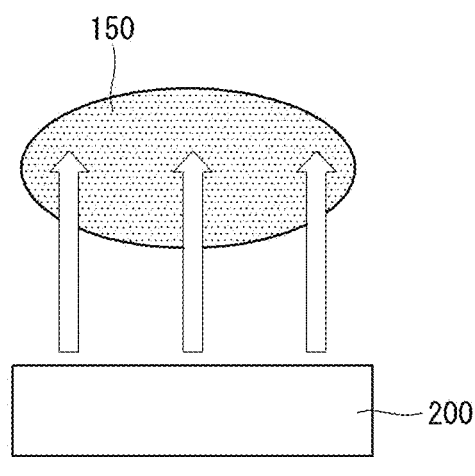
FIG. 7 is a schematic view illustrating a light path between a lens member and a display panel of the present disclosure.
Figure 7:
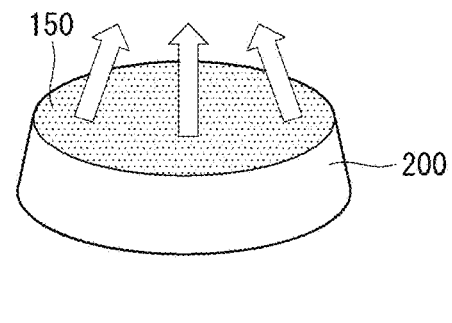

FIG. 6 is a schematic view illustrating a light path between a lens member and a display panel, and FIG. 7 is a schematic view illustrating a light path between a lens member and a display panel according to the present disclosure.

Referring to FIGS. 6 and 7, in case where the lens member 150 and the display panel 200 are spaced apart from each other and the display panel 200 is flat, the size of the lens member 150 is determined to correspond to the size in which light is emitted from the display panel 200. Meanwhile, in case where the display panel 200 is curved and adhered to the lens member 150, since light from the display panel 200 is emitted to concentrate on the center, the size of the lens member 150 may be reduced as much. The size of the lens member 150 is set to be equal to the size of the display panel 200 in order to allow light emitted from the display panel 200 to be entirely incident to the lens member 150. However, according to the present disclosure, the size of the lens member 150 may be smaller than the display panel 200. Therefore, the size of the lens member may be advantageously reduced to reduce the display apparatus in size and weight.

Figure 8:
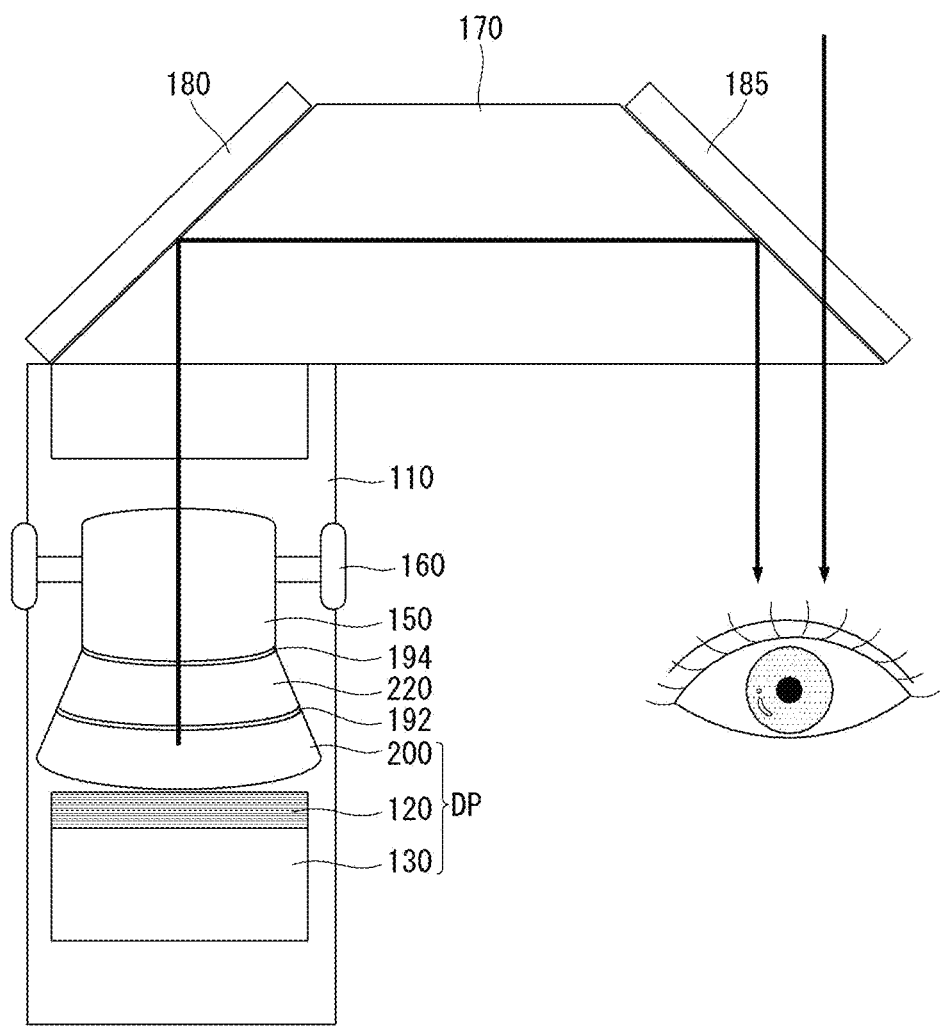
FIG. 8 is a view illustrating a display apparatus according to another aspect of the present disclosure.
Figure 9:
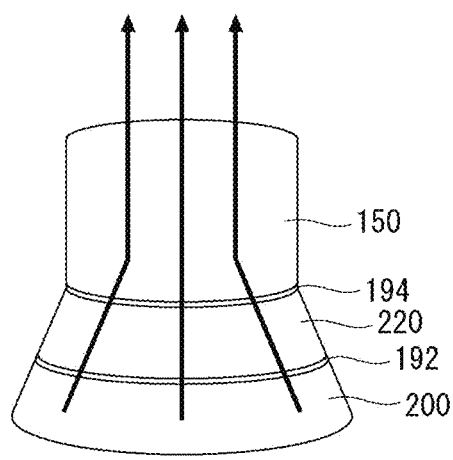
FIG. 9 is a schematic view illustrating a structure of a display panel, a compensation member, and a lens member.

FIG. 8 is a view illustrating a display apparatus according to another aspect of the present disclosure, and FIG. 9 is a schematic view illustrating a structure of a display panel, a compensation member, and a lens member. In the following description, the same reference numerals will be given to the same components as those of the above-described structure of FIG. 2, and a description thereof will be simplified.

Referring to FIG. 8, the display apparatus 100 of the present disclosure includes a display device DP, a compensation member 220, a lens member 150, a light guide 170, a reflector 180, and a transflective reflector 185.

The display device DP includes a display panel 200 for implementing an image, a PCB 130 for driving the display panel 200, and a flexible circuit board 120 applying a signal from the PCB 130 to the display panel 200. The lens member 150 serves to direct light emitted from the display panel 200 to the front reflector 180. The light guide 170 serves as a passage through which light emitted from the lens member 150 moves.

The reflector 180 is disposed on one side of the light guide 170 and changes a movement path of light to make the light traveling through the light guide 170 be incident to the user's eye. The transflective reflector 185 is positioned on the other side of the light guide 170 facing the reflector 180. The transflective reflector 185 allows light reflected from the reflector 180 to be incident to the user's eye.

In the meantime, the aspect of the present disclosure further includes a compensation member 220. The compensation member 220 is provided between the display panel 200 and the lens member 150 to further reduce the size of the lens member 150. The compensation member 220 may be selected from among polymethylmethacrylate (PMMA), polycarbonate (PC), and glass so that light may be transmitted therethrough, and a known material having high light transmittance may also be used.

The compensation member 220 is adhered to one surface of the lens member 150. The compensation member 220 is formed of the aforementioned material and has a small thickness to have flexibility. Therefore, the adhesive layer 194 is applied to one surface of the compensation member 220 and the compensation member 220 may be adhered to one surface of the lens member 150 through the adhesive layer 194. Since the compensation member 220 is curved along a curved surface of the lens member 150 and adhered to one surface of the lens member 150, the compensation member 220 has the same curvature as that of the lens member 150. The display panel 200 is adhered to the other surface of the compensation member 220 through the adhesive layer 192. The display panel 200 is curved along the curved surface of the compensation member 220 and adhered to the other surface of the compensation member 200, and thus, the display panel 200 has the same curvature as that of the compensation member 200.

Here, a width of one surface of the compensation member 220 adjacent to the lens member 150 is smaller than a width of the other surface of the compensation member 220 adjacent to the display panel 200. That is, when the width of one surface of the compensation member 200 adjacent to the lens member 150 is smaller than the width of the other surface, the width of one surface of the lens member 150 adhered to the compensation member 200 may also be reduced. Therefore, the size of the lens member 150 may further be reduced.

Referring to FIG. 9, when the compensation member 220 is provided between the lens member 150 and the display panel 200, the compensation member 220 maintains linearity of light emitted from the display panel 200. That is, the compensation member 220 may serve as a light guide for guiding light. Light emitted from the display panel 200 is converged forwards and emitted. Light incident on the compensation member 220 keeps moving in the concentrated direction as the compensation member 220 maintains linearity of light. That is, the compensation member 220 increases an optical distance from the display panel 200 to the lens member 150, reducing the size of the lens member 150 for accommodating light emitted from the display panel 200. Therefore, by further providing the compensation member 220, the size of the lens member 150 may be reduced to reduce the display apparatus in size and weight.

The bonding structure of the display panel and the compensation member corresponds to the configuration in which the lens member is replaced by the compensation member in the bonding structure of the display panel and the lens member described above. Although not shown, the adhesive layer 192 is positioned between the encapsulant layer of the display panel 200 and the compensation member 220 to adhere the display panel 200 and the compensation member 220. In another example, in case where a passivation layer is further positioned on the encapsulant layer formed in the display panel 200, the adhesive layer 192 may be positioned between the passivation layer and the compensation member 220 to adhere the display panel 200 and the compensation member 220. However, in the present disclosure, a color filter layer may further be positioned on the encapsulant layer. In this case, the adhesive layer 192 may be positioned on the color filter layer.

When the display panel 200 is adhered to the compensation member 220, the compensation member 220 supports the display panel 200. As described above, in order to prevent the display panel from warping, a support glass capable of supporting the display panel is required. However, since the compensation member 220 supports the display panel not to be warped, the support glass may be omitted, and thus, the display apparatus may be reduced in weight.

As described above, in the display apparatus according to the aspect of the present disclosure, by adhering the lens member and the display panel, the size of the lens member may be reduced to reduce the display apparatus in size and weight. In addition, since the lens member supports the display panel not to be warped, a supporting glass may be omitted, reducing the weight of the display apparatus.

In addition, the display apparatus according to the aspect of the present disclosure further includes the compensation member between the lens member and the display panel, reducing the size of the lens member to reduce the display apparatus in size and weight. In addition, since the compensation member supports the display panel not to be warped, a support glass may be omitted, reducing the weight of the display apparatus.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising:
    a display panel emitting light;
    a lens member transmitting the light emitted from the display panel;
    a light guide guiding the transmitted light through the lens member to a user's eyes;
    a reflector changing a path of the light moving along the light guide; and
    a compensation member disposed between the display panel and the lens member and guiding the light emitted from the display panel,
    wherein the compensation member is curved along a curved surface of the lens member and attached to the lens member,
    wherein the display panel is curved along a curved surface of the compensation member and attached to the compensation member,
    wherein a width of one surface of the compensation member adjacent to the lens member is smaller than a width of another surface of the compensation member adjacent to the display panel, and
    wherein a width of the compensation member is smaller than a width of the display panel and larger than a width of the lens member.

2. The display apparatus of claim 1, further comprising an adhesive layer disposed between the display panel and the lens member.

3. The display apparatus of claim 1, further comprising an adhesive layer disposed between the display panel and the compensation member and disposed between the display panel and the lens member.

4. The display apparatus of claim 3, wherein the display panel includes:
    an organic light emitting diode (OLED) positioned on a thin film transistor (TFT) array substrate; and
    an encapsulant layer positioned on the OLED.

5. The display apparatus of claim 4, wherein the adhesive layer is disposed between the encapsulant layer and the lens member.

6. The display apparatus of claim 5, further comprising a color filter layer positioned between the encapsulant layer and the adhesive layer.

7. The display apparatus of claim 1, further comprising a transflective reflector positioned on the other side of the light guide and facing the reflector.

8. A display apparatus comprising:
    a display panel;
    a lens member positioned in front of the display panel;
    a light guide positioned in front of the lens member;
    a reflector positioned on one side of the light guide; and
    a compensation member disposed between the display panel and the lens member and guiding the light emitted from the display panel,
    wherein the compensation member is curved along a curved surface of the lens member and attached to the lens member,
    wherein the display panel is curved along a curved surface of the compensation member and attached to the compensation member,
    wherein a width of one surface of the compensation member adjacent to the lens member is smaller than a width of another surface of the compensation member adjacent to the display panel, and
    wherein a width of the compensation member is smaller than a width of the display panel and larger than a width of the lens member.

9. The display apparatus of claim 8, further comprising a transflective reflector positioned on the other side of the light guide and facing the reflector.

10. A head mounted display apparatus comprising:
    a display panel emitting light;
    a lens member having a curved surface and transmitting the light emitted from the display panel;
    a light guide guiding the transmitted light through the lens member to a user's eyes;

a reflector changing a path of the light guided by the light guide;

a transflective reflector changing the light path from the reflector guided by the light guide to the user's eyes; and a compensation member disposed between the display panel and the lens member and guiding the light emitted from the display panel, wherein the compensation member is curved along a curved surface of the lens member and attached to the lens member, wherein the display panel attached to the compensation member has a curved surface matching the curved surface of the compensation member, wherein a width of one surface of the compensation member adjacent to the lens member is smaller than a width of another surface of the compensation member adjacent to the display panel, and wherein a width of the compensation member is smaller than a width of the display panel and larger than a width of the lens member.

11. The display apparatus of claim 10, wherein the display panel has a curved surface matching the curved surface of the compensation member.

12. The display apparatus of claim 10, further comprising an adhesive layer disposed between the display panel and the lens member.

13. The display apparatus of claim 11, further comprising an adhesive layer disposed between the display panel and the compensation member and disposed between the display panel and the lens member.

14. The display apparatus of claim 13, wherein the display panel includes:

an organic light emitting diode (OLED) positioned on a thin film transistor (TFT) array substrate; and an encapsulant layer positioned on the OLED.

15. The display apparatus of claim 14, wherein the adhesive layer is disposed between the encapsulant layer and the lens member.

16. The display apparatus of claim 15, further comprising a color filter layer disposed between the encapsulant layer and the adhesive layer.

* * * * *